Aug. 5, 1969 | R. J. ORWIN ET AL | 3,460,041

LINEAR POWER AMPLIFIER CIRCUIT

Filed Nov. 2, 1966 | 2 Sheets-Sheet 1

INVENTORS
Robert J. Orwin
Robert C. Stanford
BY Hofgren, Wegner, Allen, Stellman & McCord
ATTORNEYS Aug. 5, 1969 R. J. ORWIN ET AL 3,460,041

LINEAR POWER AMPLIFIER CIRCUIT

Filed Nov. 2, 1966 2 Sheets-Sheet 2

3,460,041
LINEAR POWER AMPLIFIER CIRCUIT

Robert J. Orwin, La Grange Park, and Robert C. Stanford, Warrenville, Ill., assignors, by mesne assignments, to HLF Corporation, Chicago, Ill., a corporation of California Filed Nov. 2, 1966, Ser. No. 591,568
Int. Cl. H04b 1/68
U.S. Cl. 325—50 6 Claims

ABSTRACT OF THE DISCLOSURE

A single sideband transmitter with a power amplifier stage having audio frequency feedback to reduce distortion.

This invention is concerned with an amplifier and more particularly with a linear power amplifier for a single sideband transmitter.

Many radio communication systems utilizes a modulated single sideband signal as the tarnsmission medium. This type of transmission produces greater efficiency than amplitude or frequency modulation in terms of transmitted energy effective in carrying intelligence and reduces the band-width requirements for each voice communication channel. One problem with single sideband transmissions is that non-linearity in the transmitter produces intermodulation products not only of the sideband components, but of higher order harmonics thereof. Some of these products fall in the same portion of the spectrum as the desired single sideband signal while others fall in nearby channels. In either case, these intermodulation products are unintelligible. Measures taken to improve the linearity in the transmitter, and particularly in the power output amplifier, include stabilization of the screen voltage supply (in a tetrode or pentode circuit) and establishment of quiescent bias and driving signals which maintain operation in a linear portion of the tube charactistics. This, however, serves as a limitation on the output which may be achieved and limits total power and output efficiency.

One feature of the invention is the provision in a single sideband transmitter of means for deriving from the power amplifier an audio frequency signal representative of the difference components of the single sideband and means coupling the derived audio frequency signal to the input of the power amplifier. This circuit, which in effect provides an inverse feedback of the derived audio signal reduces the relative amplitude of the more troublesome intermodulation products. More particularly, the circuit reduces substantially the level of third order distortion products from the power amplifier.

Another feature of the invention is that the power amplifier has an input circuit with a signal terminal and a reference terminal and includes means for deriving an automatic level control signal from the reference terminal. The derived audio frequency signal is applied to the signal terminal of the input circuit. Application of the feedback signal in this manner avoids interaction with the automatic level control circuitry connected to the reference terminal of the input circuit.

Yet another feature is that the power amplifier utilizes a multi-grid tube with cathode, control grid and plate electrodes and an auxiliary grid between the control grid and plate. The amplifier input circuit is connected between the control grid and cathode, and the output circuit is connected with the plate. The audio frequency signal deriving means is connected with the auxiliary grid. More particularly, the auxiliary grid, which is connected with a source of operating potential, is bypassed for the radio frequencies of the sideband signal, but not for the audio difference frequencies generated due to the non-linearity in the tube.

Further features and advantages of the invention will be readily apparent from the following specification and drawings, in which.

As will be discussed in more detail below, distortion in a single sideband transmitter gives rise to spurious signals both in the channel of the desired transmission and in other channels. Particularly in the competitive field of amateur equipment, there has been a trend to the use of high perveance tubes which conduct a high current at a low voltage, for the power amplifier stage. So long as such tubes are operated within the limits of a linear relation between input and output, there is no problem with distortion. However, in order to achieve maximum power output with small, relatively inexpensive tubes, it is necessary to select a zero signal operating point (as determined by zero signal grid bias) which keeps the tubes within the rated plate dissipation. This results in operation within a non-linear portion of the grid voltage-plate current curve, causing the generation of undesirable interference, particularly in the third order distortion products.

The circuit of the present invention provides a reduction of the amplitude of the third order distortion components, permitting operation of the output tube at a low level of average plate dissipation while obtaining therefrom a high level of peak output energy.

Figure 1:
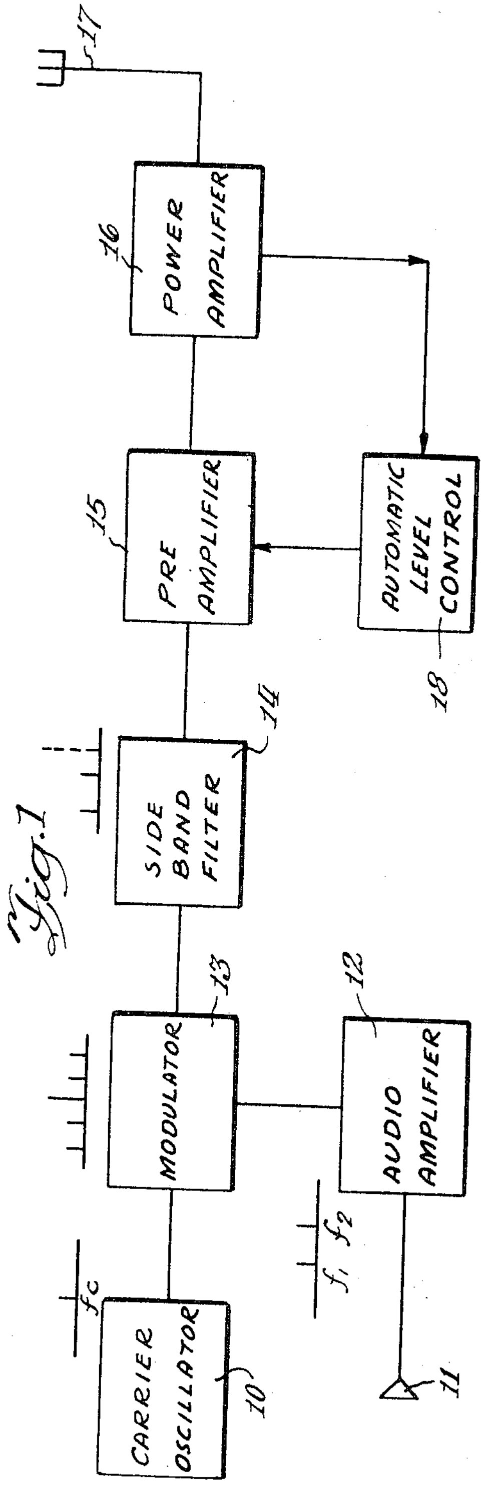
FIGURE 1 is a simplified block diagram of a single sideband transmitter.

Turning now to FIGURE 1 of the drawings, a typical single sideband transmitter includes carrier oscillator 10 and an audio source including a microphone 11 and audio amplifier 12. The outputs of the carrier oscillator 10 and audio amplifier 12 are connected with a modulator 13 from which may be derived the original carrier signal and upper and lower sidebands, as in an amplitude modulation system. A sideband filter 14 has a crystal, phasing circuitry or other suitable means for eliminating the carrier and one of the sidebands. The output of the sideband filter is connected with preamplifier 15 and a power amplifier 16. The ultimate sideband signal is connected with an antenna 17. Many transmitters incorporate an automatic level control 18 which derives a signal from the power amplifier representing the level of the sideband signal and, if the signal becomes excessive, reduces the gain of preamplifier 15.

In the system of FIGURE 1, if the carrier is designated $f_c$ and, for the discussion of the invention, it is assumed that two audio frequencies $f_1$ and $f_2$ are available, the output of the modulator 13 will include the carrier, $f_c$, and upper and lower sidebands ($f_c+f_1$, $f_c+f_2$ and $f_c-f_1$, $f_c-f_c$ and, for the discussion of the invention, it is assumed upper and lower sidebands ($f_c+f_1$, $f_c+f_2$ and $f_c-f_1$, $f_c-f_2$). Further assuming that the sideband filter 14 passes only the lower sideband, its output includes two frequencies $f_c-f_1$, $f_c-f_2$. There are no carrier or upper sideband frequencies. So long as the preamplifier 15 and the power amplifier 16 operate in a linear portion of their ranges, there is no problem. However, if one or more stages operates nonlinearly, it functions as a detector and the sums and differences of the two sideband signals and their harmonics are generated. The preamplifier 15 may have several stages of voltage amplification which operate at a relatively low level. It is not difficult to design such circuits which are linear. Furthermore, the stages of the preamplifier are coupled by tuned circuits which discriminate against signals outside the passband. The tuned circuits keep at a low level all signals except the sideband selected by filter 14. The principal problems arise in power amplifier 16.

Figure 2:
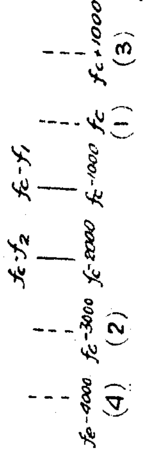
FIGURE 2 is a representation of the sideband frequencies resulting from a two-tone modulation, together with the higher amplitude distortion products.

FIGURE 2 illustrates, without regard to relative amplitude, the location in the spectrum of the desired (solid line) and undesired (broken line) signals which occur as a result of non-linearities. A two tone audio input is assumed with $$f_1=1000 \text{ c.p.s.}$$
$$f_2=2000 \text{ c.p.s.}$$

The input of the power amplifier is two signals, both in the lower sideband, $f_c-f_1$ and $f_c-f_2$. In the output of the amplifier, there appear the original signals, their harmonics and the sums and differences of the various signals and harmonics. Many of these signals are so far outside the passband of the amplifier that they are of little consequence. However, some of the products fall within the amplifier passband, or the passband of amplifiers in nearby channels and cause interference. The desired signals, $f_c-f_2$ and $f_c-f_1$ are shown in solid lines. The sum of these two signals is $2f_c-f_1-f_2$ while the difference is $f_2-f_1$. Neither is of importance. Consider, however, the difference between the second harmonic of one input signal and the fundamental of the other:

$$2(f_c-f_1)-(f_c-f_2)=f_c+f_2-2f_1 \quad (1)$$

and $$2(f_c-f_2)-(f_c-f_1)=f_c+f_1-2f_2 \quad (2)$$

and the difference between the third harmonic of one signal and the second harmonic of the other:

$$3(f_c-f_1)-2(f_c-f_2)=f_c-3f_1+2f_2 \quad (3)$$
$$3(f_c-f_2)-2(f_c-f_1)=f_c-3f_2+2f_1 \quad (4)$$

If $f_1=1000$ c.p.s. and $f_2=2000$ c.p.s., the higher order signals indicated above become:

(1) $f_c$
(2) $f_c-3000$
(3) $f_c+1000$
(4) $f_c-4000$

All of these signals lie within or immediately outside the passband of the circuitry of power amplifier 16.

Figure 3:
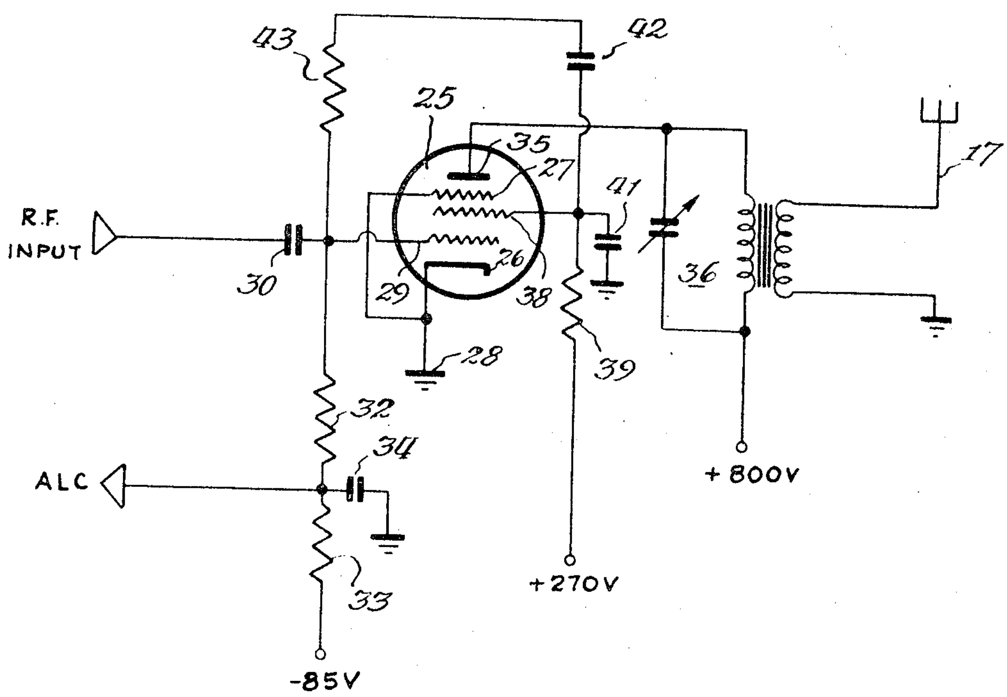
FIGURE 3 is a schematic diagram of a linear power amplifier embodying the invention.

In FIGURE 3 the invention is illustrated as embodied in a pentode power amplifier circuit utilizing a 6HF5 beam tube 25. During the course of the following description, specific values will be given for the components of the circuit. These values are intended merely to illustrate an operative circuit and are not to be considered limiting. Many changes and modifications will be obvious.

The cathode 26 and suppressor grid 27 are connected together and returned to a reference potential or ground 28. Control grid 29 is connected through a coupling capacitor 30, 100 p.f., with a source of single sideband signal, as preamplifier 15. A grid resistor 32, 100,000 ohms, is connected to the grid 29 and through resistor 33, 10,000 ohms, with a bias source of the order of −85 volts. The junction between resistors 32 and 33 is grounded for RF and audio frequencies through capacitor 34, 0.01 $\mu$f. and the sideband input signal to the amplifier is effectively applied between control grid 29 and cathode 28. An automatic level control (ALC) signal is derived from the junction between resistors 32 and 33, is amplified, rectified and applied to a fixed tuned intermediate frequency amplifier. Plate 35 is connected through a parallel tuned circuit 36 with a source of operating potential of the order of +800 volts. The output of the amplifier is transformer coupled from the inductor of tuned circuit 36 to antenna 17. The screen grid 38, between control grid 29 and suppressor grid 27, is connected through resistor 39, 22,000 ohms, with an operating potential source, +270 volts.

In accordance with the invention, the screen grid of the power amplifier is bypassed to ground for radio frequency signals through capacitor 41, 0.002 $\mu$f., but is not fully bypassed for audio frequency signals. An audio frequency signal developed at the screen grid, which contains various products of the signals applied to the control grid, is coupled through DC blocking capacitor 42, 0.01 $\mu$f., and resistor 43, 220,000 ohms, to the control grid, providing a degenerative feedback effect. The frequency discriminating effect of the screen grid circuit is apparent when it is considered that the reactance of capacitor 41 at 5 kilocycles is 15,900 ohms while at 100 kilocycles it is 795 ohms. Resistors 32 and 43 form a voltage divider so that only a portion of the audio frequency signal at the screen grid is applied to the control grid.

Figure 4:
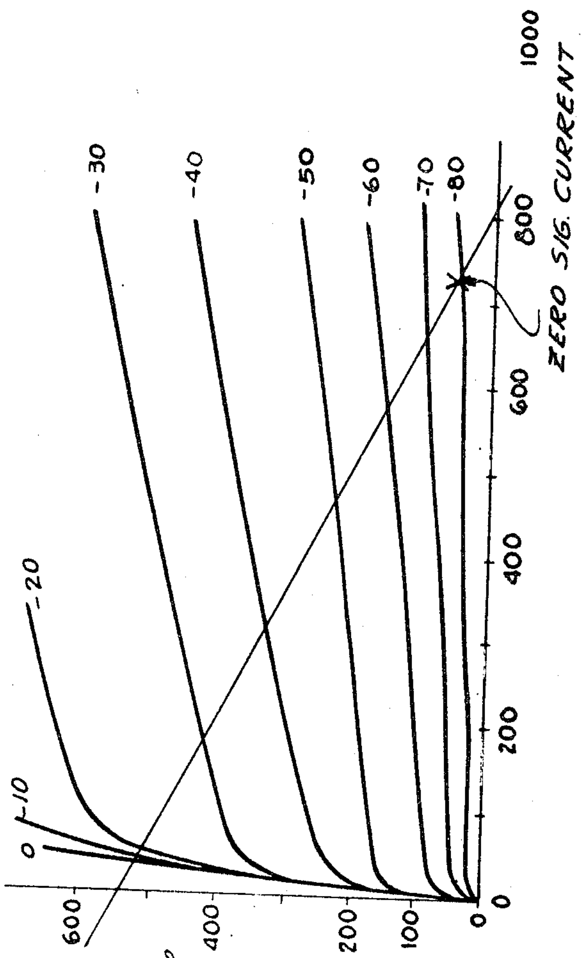
FIGURE 4 is a characteristic operating curve for the amplifier with the range of operation indicated.

In FIGURE 4, a family of plate current curves are plotted as a function of plate voltage, with separate curves for different grid voltages. A representative load line 44 for the circuit of FIGURE 3 is plotted on the curves for a plate load impedance of the order of 1450 ohms and with a grid bias of the order of −85 volts. It is necessary that the amplifier be biased to draw relatively little current under no signal conditions so that average dissipation will not exceed the tube rating. This results in non-linear operation. As pointed out above, the non-linear operation of the tube gives rise to the generation of undesired signal components.

Figure 5:
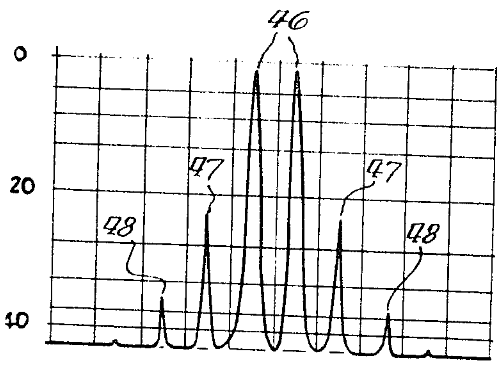
FIGURE 5 is a reproduction of an oscillogram illustrating the relative amplitude of the desired sideband frequencies and distortion products in an amplifier without the feedback network of the invention.
Figure 6:
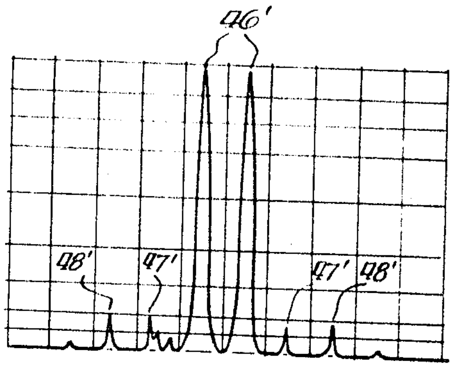
FIGURE 6 is a similar reproduction of an oscillogram illustrating the relative amplitude of the signals in an amplifier embodying the invention.

If the amplifier is operated without the feedback network from the screen grid to the control grid, these undesired modulation products have a substantial amplitude. In FIGURE 5 the output of the power amplifier is plotted in db as a function of frequency. The curve represents the relative energy in the desired sideband signals 46, the third order distortion products 47 and the fifth order distortion products 48. With the feedback network of FIGURE 3, in the circuit and the same operating conditions, the curve of FIGURE 6 is obtained. Here, the desired sideband signals 46' have the same amplitude as in FIGURE 5 while the third order distortion products 47' are reduced to approximately the level of the fifth order products 48', which are about the same amplitude as in FIGURE 5. This represents a reduction of the third order distortion from 20 db below the desired signals to about 35 db down.

The input to the power amplifier from the preceding driver stage is essentially the two desired sideband signals representing the two modulating frequencies. The simple situation of two modulating tones is used for the purpose of illustration, with speech modulation, the action is the same, but the arithmetic more complex. As the tube is operating in the non-linear portion of its characteristics, the screen current as well as the plate current includes sum and difference components. The audio frequency signal at the screen grid includes as its principal component the difference signals between the two inputs.

$$(f_c-f_2)-(f_c-f_1)=f_1-f_2 \quad (5)$$

and higher order audio frequency products. It is believed, however, that only the first order difference signal is of significance in reducing the output distortion products. The amplitude of the feedback voltage is adjusted by proper selection of the ratio between resistors 32 and 43. Although it has been found that the third order distortion products can be substantially completely eliminated by use of proper amplitude of feedback voltage, the establishment of this operating condition has the effect of increasing the fifth order distortion products. Accordingly, the operating conditions illustrated in FIGURE 6 represent a compromise for minimum distortion energy.

It is desirable that the feedback signal be isolated from the automatic level control circuitry or the limiting action is impaired. In the circuit of FIGURE 3, the feedback signal is applied to the high potential end of the grid resistor 32 and the other end of the resistor, from which the automatic level control potential is obtained, is grounded through capacitor 34 for audio and higher frequency signals. The automatic level control operates generally as follows. When the grid of the RF power amplifier is driven from class AB operation into the $AB_2$ region, grid current flows through resistor 32 causing a rise in the fixed bias voltage. The bias rise appears as a pulse which is coupled to an amplifier and filter network (not shown) from which a negative bias control potential is developed and applied to the preamplifier.

The characteristics of the feedback network for the linear amplifier have been found to be substantially independent of the carrier frequency so that the circuit need not be modified in switching bands on a multi-band transmitter. The use of the circuit permits operation of the power amplifier with a fixed bias established in the nonlinear portion of the operating curve, without generating sufficient distortion products to be objectionable. This in turn allows the utilization of smaller, less expensive amplifier tubes than would otherwise be possible. In addition, these tubes draw less fixed DC current from the power supply than would other tubes capable of the same RF power output.

It is not necessary that the feedback voltage be obtained from the screen grid, although it is a handy source which does not require the addition of expensive components to the circuit. A non-linear detector could be connected with the plate circuit of the amplifier, for example, and its output used as the feedback voltage.

While we have shown and described certain embodiments of our invention, it is to be understood that it is capable of many modifications. Changes, therefore, in the construction and arrangement may be made without departing from the spirit and scope of the invention as disclosed in the appended claims.

We claim:

1. In a single sideband transmitter having a carrier source, a modulation source, means for generating a single sideband signal therefrom, a preamplifier and a power amplifier coupled to said generating means to amplify signals, the amplified signals including said single sideband signal and an undesired intermodulation signal resulting from nonlinearity in the power amplifier, the improvement which comprises: means for deriving from said power amplifier an audio frequency signal representative of the difference of components of said single sideband signal, including means for eliminating radio frequency signals from the derived radio frequency signal; and means coupling said derived audio frequency signal to the input of said power amplifier to reduce said undesired intermodulation signal.

2. The single sideband transmitter of claim 1 including a resistive voltage divider in said coupling means.

3. The single sideband transmitter of claim 1 including a direct current blocking capacitor connected in series between said signal deriving means and the input of said power amplifier.

4. The single sideband transmitter of claim 1 wherein said power amplifier has an input circuit with a signal terminal and a reference terminal and including means for deriving an automatic level control signal from said reference terminal and means for applying said audio frequency signal to said signal terminal.

5. The single sideband transmitter of claim 1 wherein said power amplifier is a multi-grid tube having cathode, control grid and plate electrodes with an auxiliary grid between said control grid and plate, said amplifier having an input circuit connected between said control grid and cathode, an input circuit connected with said plate and wherein said audio frequency signal deriving means is connected with said auxiliary grid.

6. The single sideband transmitter of claim 5 wherein said eliminating means connects said auxiliary grid with a source of operating potential, said eliminating means including bypass circuitry for sideband frequencies having substantial impedance at the audio difference frequency.

References Cited

UNITED STATES PATENTS

| | | | |
|---|---|---|---|
| 2,721,909 | 10/1955 | Davies | 330—96 |
| 3,024,313 | 3/1962 | Ensink | 325—137 |
| 3,332,016 | 7/1967 | Pokorny | 325—50 |

ROBERT L. GRIFFIN, Primary Examiner

ALBERT J. MAYER, Assistant Examiner

U.S. Cl. X.R.

330—96, 111

PO-1050
(5/69)

UNITED STATES PATENT OFFICE
CERTIFICATE OF CORRECTION

Patent No. 3,460,041 Dated August 5, 1969

Inventor(s) Robert J. Orwin and Robert C. Stanford

It is certified that error appears in the above-identified patent and that said Letters Patent are hereby corrected as shown below:

Assignee should read "The Hallicrafters Co., a California corporation".

SIGNED AND
SEALED
DEC 23 1969

(SEAL)
Attest:

Edward M. Fletcher, Jr.
Attesting Officer

WILLIAM E. SCHUYLER, JR.
Commissioner of Patents